United States Patent
Imamura

(10) Patent No.: US 10,288,708 B2
(45) Date of Patent: May 14, 2019

(54) MAGNETIC-RESONANCE IMAGING APPARATUS

(71) Applicant: TOSHIBA MEDICAL SYSTEMS CORPORATION, Otawara-shi (JP)

(72) Inventor: Naho Imamura, Tochigi (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 1050 days.

(21) Appl. No.: 14/699,180

(22) Filed: Apr. 29, 2015

(65) Prior Publication Data

US 2015/0316633 A1 Nov. 5, 2015

(30) Foreign Application Priority Data

May 2, 2014 (JP) .................. 2014-095552

(51) Int. Cl.

| G01R 33/54 | (2006.01) |
|---|---|
| G01R 33/56 | (2006.01) |
| G01R 33/385 | (2006.01) |
| G01R 33/30 | (2006.01) |
| G01R 33/48 | (2006.01) |
| G01R 33/561 | (2006.01) |

(Continued)

(52) U.S. Cl.
CPC ......... *G01R 33/543* (2013.01); *G01R 33/307* (2013.01); *G01R 33/385* (2013.01); *G01R 33/4822* (2013.01); *G01R 33/561* (2013.01); *G01R 33/5607* (2013.01); *G01R 33/3875* (2013.01); *G01R 33/4838* (2013.01); *G01R 33/5611* (2013.01)

(58) Field of Classification Search
CPC . G01R 33/385; G01R 33/307; G01R 33/5607
See application file for complete search history.

(56) References Cited

U.S. PATENT DOCUMENTS 6,348,793 B1 2/2002 Balloni et al.
7,051,286 B1 * 5/2006 Stemmer ............. G06F 19/00
715/762

(Continued)

FOREIGN PATENT DOCUMENTS

JP 2002-233514 A 8/2002
JP 2012-232111 A 11/2012

(Continued)

OTHER PUBLICATIONS

Japanese office action dated Mar. 6, 2018, in Patent Application No. JP 2014-095552.

*Primary Examiner* — Thang X Le
*Assistant Examiner* — Alvaro E Fortich
(74) *Attorney, Agent, or Firm* — Nixon & Vanderhye P.C.

(57) ABSTRACT

A magnetic-resonance imaging apparatus according to an embodiment includes processing circuitry. The processing circuitry registers a predetermined protocol set that is selected from among multiple protocol sets preset in a storage unit as a protocol set that is to be executed in an examination of a subject. The processing circuitry accepts an instruction indicating whether to include a check protocol to check an influence of fat suppression in the examination. When the instruction is accepted, the processing circuitry incorporates the check protocol in the protocol set to be executed.

17 Claims, 7 Drawing Sheets

(51) Int. Cl.
*G01R 33/3875* (2006.01)
*G01R 33/483* (2006.01)

(56) References Cited

U.S. PATENT DOCUMENTS

| | | |
|---|---|---|
| 8,076,935 B2 | 12/2011 | Kitane et al. |
| 8,436,611 B2 | 5/2013 | Kitane et al. |
| 9,435,871 B2 | 9/2016 | Hirai |
| 9,864,036 B2 | 1/2018 | Kitane et al. |
| 2003/0060697 A1* | 3/2003 | Zhang .............. A61B 5/055 600/410 |
| 2004/0056660 A1* | 3/2004 | Yatsui .............. A61B 5/055 324/309 |
| 2006/0064004 A1* | 3/2006 | Machida ........... A61B 5/055 600/410 |
| 2007/0162159 A1* | 7/2007 | Ladenburger ...... G06F 19/00 700/17 |
| 2008/0238421 A1 | 10/2008 | Kitane et al. |
| 2009/0091324 A1* | 4/2009 | Sugiura ............ G01R 33/4828 324/309 |
| 2010/0194388 A1 | 8/2010 | Kitane et al. |
| 2011/0137598 A1* | 6/2011 | Kuehn .............. G01R 33/543 702/85 |
| 2013/0088226 A1* | 4/2013 | Miyazaki .......... G01R 33/5607 324/309 |
| 2013/0147480 A1 | 6/2013 | Sueoka et al. |
| 2013/0193971 A1 | 8/2013 | Kitane et al. |
| 2013/0293231 A1 | 11/2013 | Hirai |

FOREIGN PATENT DOCUMENTS

| | | |
|---|---|---|
| JP | 2013-005985 A | 1/2013 |
| JP | 2013-99449 | 5/2013 |
| JP | 2013-215627 A | 10/2013 |
| WO | WO 2011/059017 | 5/2011 |
| WO | 2012/098955 A1 | 7/2012 |

* cited by examiner

MAGNETIC-RESONANCE IMAGING APPARATUS

CROSS-REFERENCE TO RELATED APPLICATIONS

This application is based upon and claims the benefit of priority from Japanese Patent Application No. 2014-95552, filed on May 2, 2014, the entire contents of all of which are incorporated herein by reference.

FIELD

Embodiments described herein relate generally to a magnetic-resonance imaging apparatus.

BACKGROUND

Magnetic resonance imaging (MRI) is an imaging technique in which nuclear spins of a subject that is placed in a static magnetic field are magnetically excited by radio frequency (RF) pulses at Larmor frequency thereof, and an image is generated from data of a magnetic resonance signal that is generated with this excitation.

In this magnetic resonance imaging, for example, to collect signals while suppressing signals from fat, imaging with fat suppression has been performed. As examples of a fat suppression technique, a short time inversion recovery (STIR), a chemical shift selective (CHESS) method, a spectral presaturation with inversion recovery (SPIR), a polarity alternated spectral and spatial selective acquisition (PASTA), and the like have been known.

DETAILED DESCRIPTION

A magnetic-resonance imaging apparatus according to an embodiment includes processing circuitry. The processing circuitry registers a predetermined protocol set that is selected from among multiple protocol sets preset in a storage unit as a protocol set that is to be executed in an examination of a subject. The processing circuitry accepts an instruction indicating whether to include a check protocol to check an influence of fat suppression in the examination. When the instruction is accepted, the processing circuitry incorporates the check protocol in the protocol set to be executed.

The magnetic-resonance imaging apparatus (hereinafter, "MRI apparatus" as appropriate) according to an embodiment is explained below with reference to the drawings. Embodiments are not limited to the following embodiments. Moreover, what is explained in each embodiment is similarly applicable to the other embodiments in principle.

First Embodiment

Figure 1:
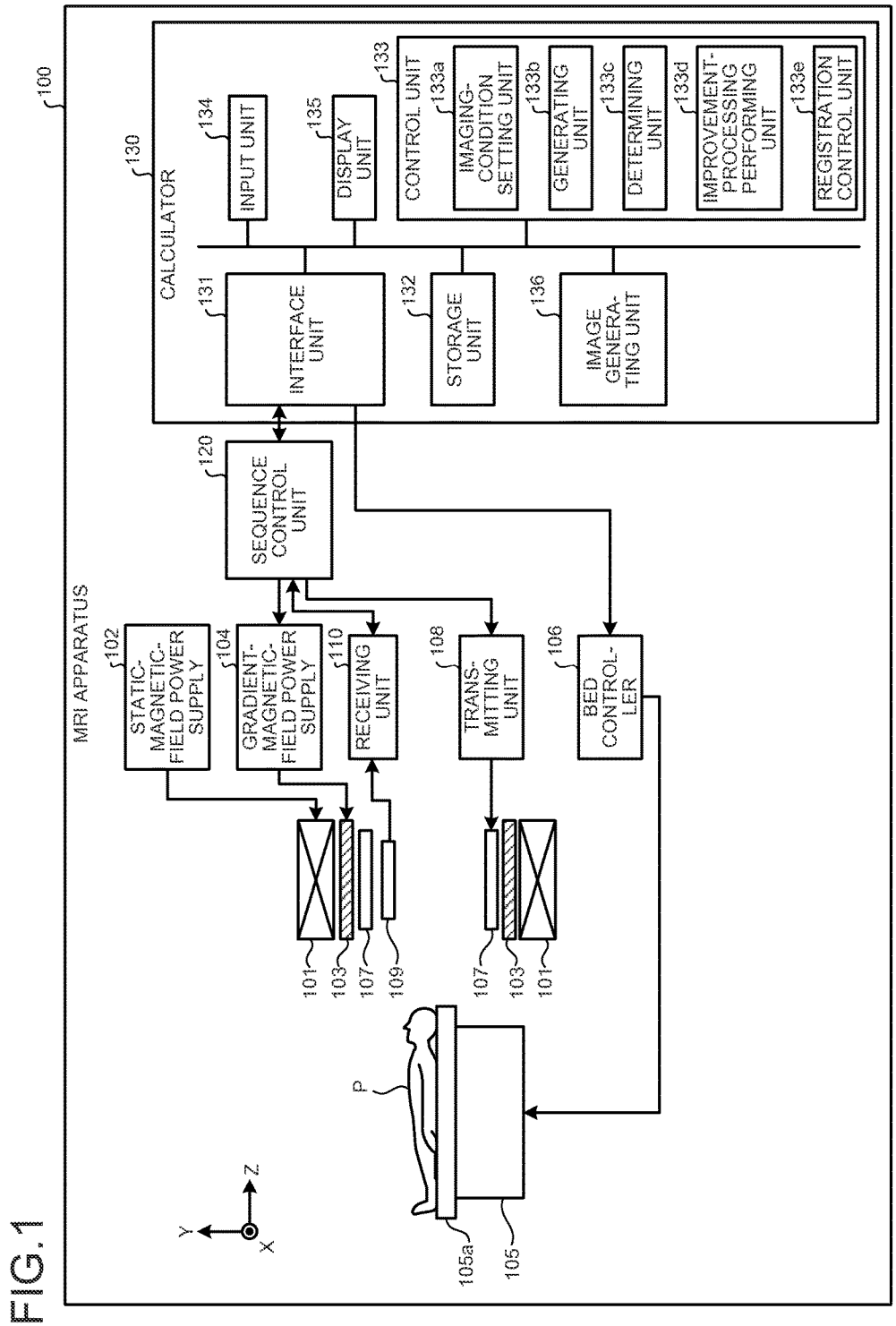
FIG. 1 is a functional block diagram showing a configuration of an MRI apparatus according to a first embodiment.

FIG. 1 is a functional block diagram showing a configuration of an MRI apparatus 100 according to a first embodiment. As shown in FIG. 1, the MRI apparatus 100 includes a static field magnet 101, a static-magnetic-field power supply 102, a gradient magnetic-field coil 103, a gradient-magnetic-field power supply 104, a bed 105, a bed controller 106, a transmission coil 107, a transmitting unit 108, reception coil 109, a receiving unit 110, a sequence control unit 120, and a calculator 130. Note that a subject P (for example, human body) is not included in the MRI apparatus 100. Furthermore, the configuration shown in FIG. 1 is only one example. For example, the respective components in the sequence control unit 120 and the calculator 130 may be integrated or separated appropriately.

The static field magnet 101 is a magnet that is formed in a hollow cylindrical shape, and generates a static magnetic field in a space inside. The static field magnet 101 is, for example, a superconducting magnet, or the like, and receives supply of electric current from the static-magnetic-field power supply 102 to be energized. The static-magnetic-field power supply 102 supplies electric current to the static field magnet 101. The static field magnet 101 may also be a permanent magnet, and in this case, the MRI apparatus 100 is not required to have the static-magnetic-field power supply 102. Moreover, the static-magnetic-field power supply 102 may be arranged separately from the MRI apparatus 100.

The gradient magnetic-field coil 103 is a coil formed in a hollow cylindrical shape, and is arranged inside the static field magnet 101. The gradient magnetic-field coil 103 is formed by combining three coils that correspond to respective axes X, Y, and Z perpendicular to each other. These three coils receive supply of electric current from the gradient-magnetic-field power supply 104 independently, to generate a gradient magnetic field the intensity of which varies along each of the axes X, Y, and Z. The gradient magnetic fields of the respective axis X, Y, and Z generated by the gradient magnetic-field coil 103 are, for example, a gradient magnetic field for slice Gs, a gradient magnetic field for phase encoding Ge, and a gradient magnetic field for reading Gr. The gradient-magnetic-field power supply 104 supplies electric current to the gradient magnetic-field coil 103.

The bed 105 includes a top panel 105a on which the subject P is mounted, and inserts the top panel 105a in a state in which the subject P is mounted thereon into the hollow (imaging opening) of the gradient magnetic-field coil 103 under control by the bed controller 106. Usually, the bed 105 is arranged such that the longitudinal direction thereof is in parallel with the central axis of the static field magnet 101. The bed controller 106 drives the bed 105 under control of the calculator 130 to move the top panel 105a in the longitudinal direction and the vertical direction.

The transmission coil 107 is arranged inside the gradient magnetic-field coil 103, and receives an RF pulse from the transmitting unit 108 to generate a high-frequency magnetic field. The transmitting unit 108 supplies the RF pulse corresponding to a Larmor frequency that is determined based on a type of a subject atom and the intensity of a magnetic field, to the transmission coil 107.

The reception coil 109 is arranged inside the gradient magnetic-field coil 103, and receives a magnetic resonance signal (hereinafter, "MR signal" as appropriate) that is emitted from the subject P by the influence of the high-frequency magnetic field. Upon receiving the MR signal, the reception coil 109 outputs the received MR signal to the receiving unit 110.

The transmission coil 107 and the reception coil 109 described above are only one example, and are only required to be configured with one, or by combining ones of a coil having only a transmitting function, a coil having only a receiving function, and a coil having a transmitting and receiving functions.

The receiving unit 110 detects an MR signal that is output from the reception coil 109, and generates MR data based on the detected MR signal. Specifically, the receiving unit 110 generates MR data by performing digital conversion on the MR signal output from the reception coil 109. Furthermore, the receiving unit 110 transmits the generated MR data to the sequence control unit 120. The receiving unit 110 may be equipped on a mount unit side on which the static field magnet 101, the gradient magnetic-field coil 103, and the like are equipped.

The sequence control unit 120 performs imaging of the subject P by driving the gradient-magnetic-field power supply 104, the transmitting unit 108, and the receiving unit 110 based on sequence information that is transmitted from the calculator 130. The sequence information is information defining a procedure to perform imaging. In the sequence information, the intensity of electric current to be supplied to the gradient magnetic-field coil 103 by the gradient-magnetic-field power supply 104 and timing of supplying the electric current, the intensity of RF pulses to be supplied to the transmission coil 107 by the transmitting unit 108 and timing of applying the RF pulses, timing of detecting an MR signal by the receiving unit 110, and the like are defined. For example, the sequence control unit 120 is an integrated circuit such as an application specific integrated circuit (ASIC), a field programmable gate array (FPGA), or is an electric circuit such as a central processing unit (CPU), and a micro processing unit (MPU).

Receiving MR data from the receiving unit 110 as a result of imaging the subject P by driving the gradient-magnetic-field power supply 104, the transmitting unit 108, and the receiving unit 110, the sequence control unit 120 transfers the received MR data to the calculator 130.

The calculator 130 performs overall control of the MRI apparatus 100, generation of an image, and the like. The calculator 130 includes an interface unit 131, a storage unit 132, a control unit 133, an input unit 134, a display unit 135, and an image generating unit 136.

The interface unit 131 transmits the sequence information to the sequence control unit 120, and receives MR data from the sequence control unit 120. Moreover, receiving MR data, the interface unit 131 stores the received MR data in the storage unit 132. The MR data stored in the storage unit 132 is arranged in a k-space by the control unit 133. As a result, the storage unit 132 stores k-space data.

The storage unit 132 stores MR data that is received by the interface unit 131, k-space data arranged in a k-space by the control unit 133, image data that is generated by the image generating unit 136, and the like. For example, the storage unit 132 is a semiconductor memory device such as a random access memory (RAM) and a flash memory, a hard disk, an optical disk, or the like.

The control unit 133 performs overall control of the MRI apparatus 100, and controls imaging, generation of an image, display of an image, and the like. For example, the control unit 133 is an integrated circuit such as ASIC and FPGA, or an electronic circuit such as CPU and MPU.

Furthermore, the control unit 133 includes an imaging-condition setting unit 133a, a generating unit 133b, a determining unit 133c, an improvement-processing performing unit 133d, and a registration control unit 133e. Details of processing performed by the imaging-condition setting unit 133a, the generating unit 133b, the determining unit 133c, the improvement-processing performing unit 133d, and the registration control unit 133e are described later.

The input unit 134 accepts input of various kinds of instructions or data from an operator. The input unit 134 is a pointing device such as a mouse and a trackball, a selecting device such as a mode switch, or an input device such as a keyboard. The display unit 135 displays a graphical user interface (GUI) for accepting input of an imaging condition, an image generated by the image generating unit 136, and the like. The display unit 135 is, for example, a display device such as a liquid crystal display.

The image generating unit 136 reads k-space data from the storage unit 132, and generates an image by performing reconstruction processing such as the Fourier transform on the read k-space data.

In magnetic resonance imaging, for example, to collect signals while suppressing signals from fat, imaging with fat suppression has been performed. As examples of a fat suppression technique, STIR, CHESS, SPIR, PASTA, and the like have been known.

However, there is a case in which sufficient fat suppression effect cannot be obtained in the imaging with fat suppression described above. For example when a part having a lot of fat components such as a breast, there is a case in which sufficient fat suppression effect cannot be obtained. In such a case, re-imaging is to be performed. Re-imaging is tough for the subject P also. Furthermore, there are types of imaging for which re-imaging is difficult such as imaging using a contrast agent.

Moreover, there is a case in which test scan is performed prior to imaging (imaging scan) with fat suppression to determine whether sufficient fat suppression effect is obtained in advance. This test scan is simplified imaging with fat suppression. However, to perform test scan, an operator is required to create a protocol for test scan. Furthermore, if it is found that fat suppression effect is not sufficient by test scan, the operator is required to search for an improvement means by himself/herself.

Therefore, the MRI apparatus 100 according to the first embodiment performs the following processing to perform imaging with fat suppression appropriately.

Figure 2:
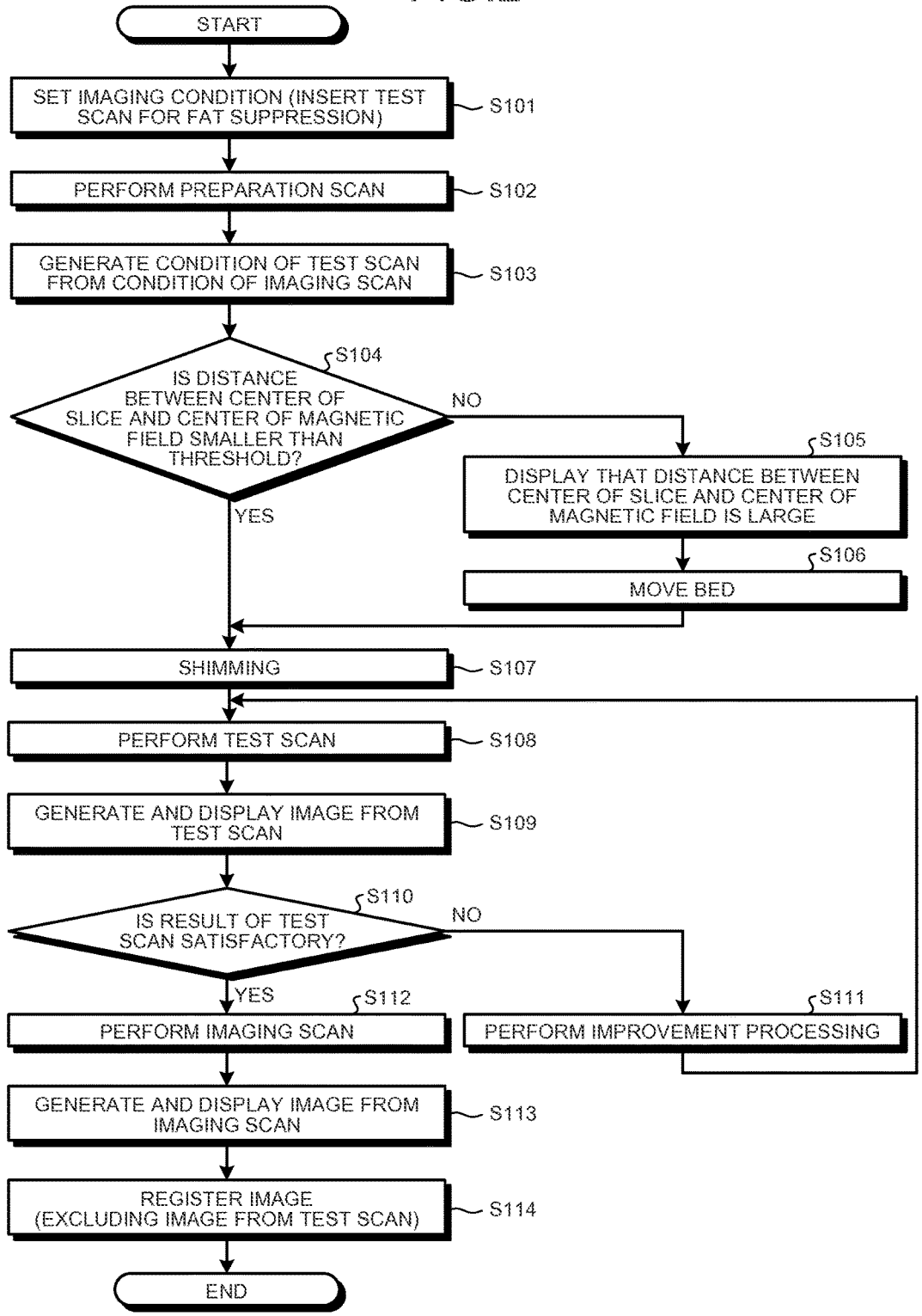
FIG. 2 is a flowchart of a processing procedure in the first embodiment.

FIG. 2 is a flowchart of a processing procedure in the first embodiment. The processing procedure in the first embodiment is explained below referring to FIG. 3 to FIG. 5.

First, the imaging-condition setting unit 133a accepts input of an imaging condition by an operator through the input unit 134, and generates sequence information according to the accepted imaging condition (step S101). In other words, the imaging-condition setting unit 133a as a registering unit registers a predetermined protocol set that is selected from among multiple protocol sets preset in the storage unit, as a protocol set to be executed in an examination of a subject.

Moreover, the sequence control unit 120 performs collection of a positioning image, and other preparation scans (excluding shimming described later), in parallel with setting of an imaging condition at step S101 (step S102).

Although the setting of an imaging condition is explained herein as processing at S101 for convenience of explanation, the setting of an imaging condition may be performed not only prior to the preparation scan but also at various timing such as after a preparation scan like collection of a positioning image, and between imaging scans.

Figure 3:
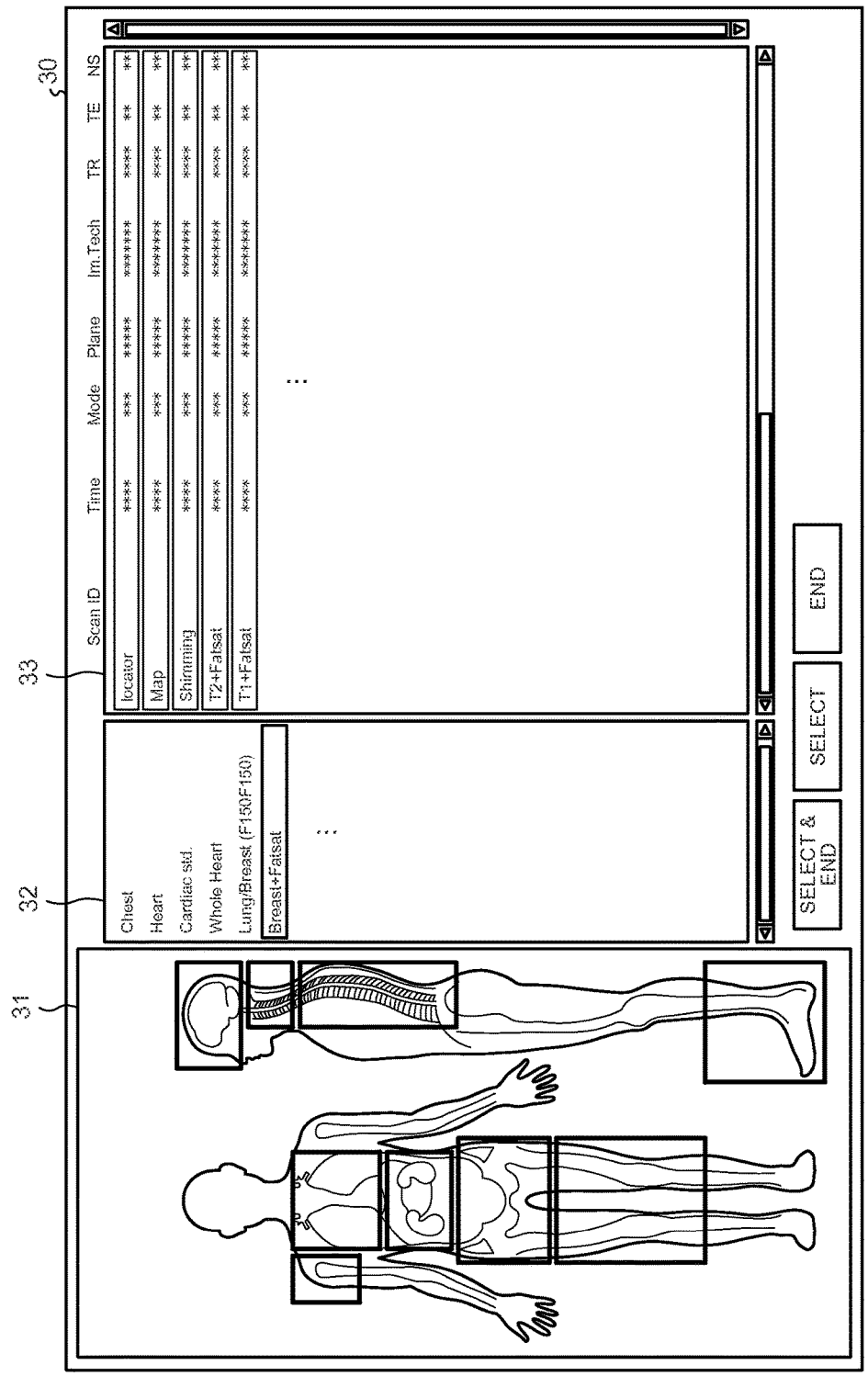
FIG. 3 is a diagram showing one example of a display screen for imaging condition input in the first embodiment.

FIG. 3 is a diagram showing one example of a display screen 30 for imaging planning in the first embodiment. For example, as shown in FIG. 3, on the display screen 30, a region 31 in which selection for each imaging part is accepted on an anatomical chart, a region 32 in which a general term of a set of imaging protocols (protocol set) are displayed, and a region 33 in which a list of protocols that are included in each protocol set displayed in the region 32 are sequentially displayed from left. On this display screen 30, for example, an operator specifies a desirable protocol to be executed in one examination, by making selection in the region 31, the region 32, and the region 33 in order according to the hierarchical structure.

For example, when an operator selects a rectangle corresponding to "Chest" in the region 31, a list of general terms of protocol sets that related to "Chest" are displayed in the region 32. Subsequently, when the operator selects "Breast+Fatsat" that is a general term of a protocol set for imaging breasts with fat suppression, a list of protocols included in this protocol set is displayed in the region 33. In this list, one or more of a protocol of an imaging scan to collect image data of an output image, and a protocol of a preparation scan that is performed to prepare for an imaging scan or image generation are included. For example, the protocol of a preparation scan includes a protocol for collecting a positioning image, a protocol for collecting a sensitivity map, a protocol for shimming, and the like. Moreover, for parameters included in each protocol, initial values are set. For example, when the operator selects a desired protocol from the list displayed in the region 33, a window to input parameters of the selected protocol is displayed. As described, the protocol sets are provided as preset data.

Figure 4:
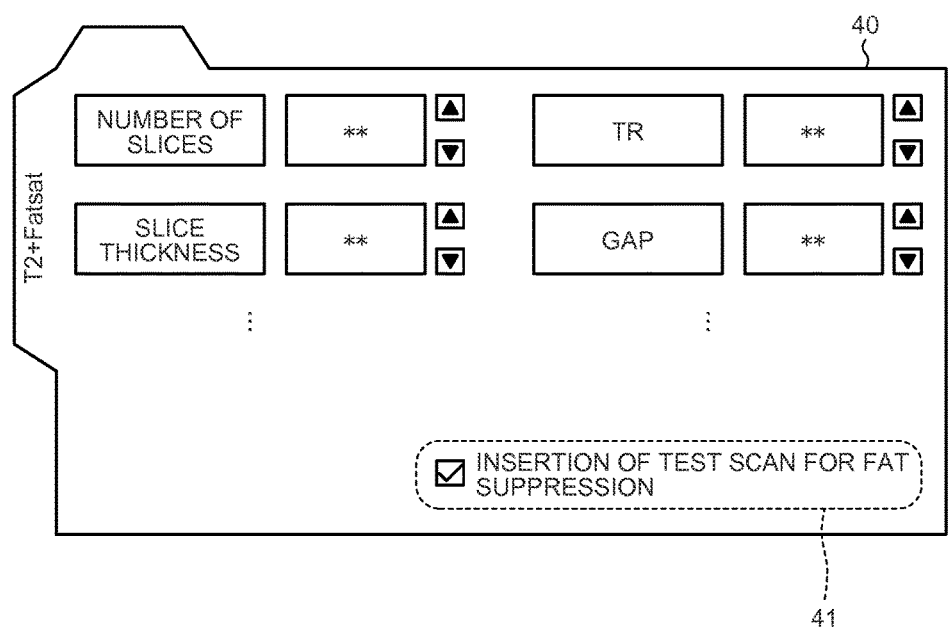
FIG. 4 is a diagram showing one example of a window for parameter input in the first embodiment.

FIG. 4 is a diagram showing one example of a window 40 for parameter input in the first embodiment. In FIG. 4, a protocol corresponding to "T2+Fatsat" is selected in the region 33 in FIG. 3 is exemplified. As shown in FIG. 4, in the window 40, initial values of various kinds of parameters such as the number of slices, slice thickness, repetition time (TR), and gap, for example are input. On this window 40, after checking the initial values of the various kinds of parameters, or editing the parameters, the operator confirms input in the window 40 by pressing an end button. Thus, the imaging-condition setting unit 133a accepts input of an imaging condition for the protocol "T2+Fatsat".

In the first embodiment, the imaging-condition setting unit 133a accepts an instruction to check the influence of fat suppression when a scan (image scan) with fat suppression is to be performed. For example, as shown in FIG. 4, in the window 40 for inputting parameters of "T2+Fatsat", a checkbox 41 to make a selection whether to insert a test scan for fat suppression is provided. The operator instructs whether to include a test scan in the protocol set by determining whether to mark the checkbox 41. For example, when a test scan is wished to be performed, the operator confirms the input of the window 40 in a state in which the checkbox 41 is marked. Thus, the imaging-condition setting unit 133a accepts an instruction to include a test scan in the protocol set from the operator. When accepting the instruction to include a test scan in the protocol set, the imaging-condition setting unit 133a adds a protocol for a test scan to the set of protocols that have been selected previously as protocols to be performed in this examination. A test scan is regarded as one of preparation scans. In other words, the imaging-condition setting unit 133a as the accepting unit accepts an instruction whether to include a check protocol to check the influence of fat suppression in the examination. The test scan is one example of the check protocol.

Figure 5:
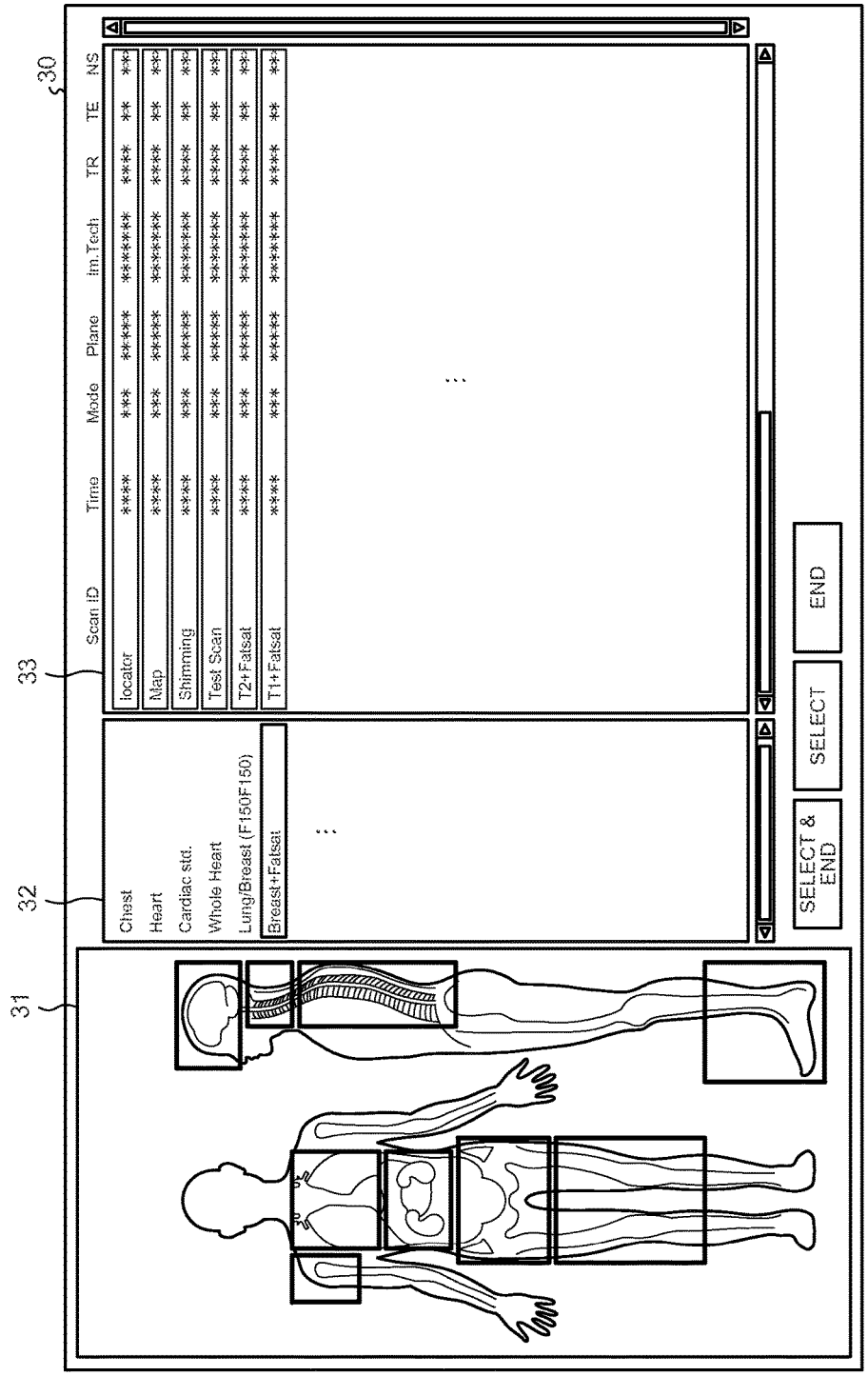
FIG. 5 is a diagram showing one example of a case in which a test scan is inserted on the display screen shown in FIG. 3.

FIG. 5 is a diagram showing one example of a case in which a test scan is inserted on the display screen 30 shown in FIG. 3. For example, as shown in FIG. 5, the imaging-condition setting unit 133a inserts a protocol of "Test Scan" before the protocol of "T2+Fatsat" in the region 33.

As described, the operator performs input of imaging conditions by inputting various kinds of parameters for each protocol. The imaging-condition setting unit 133a thus accepts specification of a desired protocol set to be executed, and generates the sequence information according to the imaging condition defined by the respective protocols. Note that FIG. 3 to FIG. 5 are only one example shown for convenience of explanation, and data displayed in each region can be changed arbitrarily according to forms of operations, for example. For example, it is not limited to a checkbox to accept an instruction whether to include a test scan in a protocol set, but an arbitrary form may be applied to the operation, for example, by using a menu bar.

Subsequently, the generating unit 133b generates a condition of the test scan based on the condition of the imaging scan set at step S101 (step S103). For example, the generating unit 133b acquires various kinds of parameters that have been confirmed from the protocol of "T2+Fatsat", and generates a protocol for the test scan by changing a part of the parameters so that imaging by this protocol is completed in a short time. Specifically, the generating unit 133b changes a parameter that can shorten the imaging time among the parameters of the acquired protocol. Examples of the parameter that can shorten the imaging time include the number of phase encoding, the number of slices, a speed rate (thin-out rate) in parallel imaging, a TR, and the like. For example, the generating unit 133b generates the protocol of the test scan by decreasing the number of phase encoding, reducing the number of slices, increasing the speed rate in parallel imaging, or by reducing TR. In other words, the generating unit 133b derives a parameter of the check protocol by changing a value of at least one of the number of phase encoding, the number of slices, the speed rate in parallel imaging, and the repetition time among parameters of a protocol with fat suppression.

Subsequently, the determining unit 133c calculates a center of slice based on an imaging region (FOV) of the test scan generated at step S103, and determines whether a distance between the calculated center of slice and a center of magnetic field is smaller than a threshold (step S104). In other words, when the check protocol is incorporated in the protocol set to be executed, the determining unit 133c determines whether a distance between the imaging region of the check protocol and a center of magnetic field satisfies a predetermined condition prior to execution of the check protocol.

When the distance between the center of slice and the center of magnetic field is equal to or larger than the threshold (step S104: NO), the determining unit 133c displays that the distance between the center of slice and the center of magnetic field is equal to or larger than the threshold (step S105). For example, the determining unit 133c causes the display unit 135 to display such a message that "Center of slice is apart from center of magnetic field. Do you want to move bed?". When a reaction thereto such as repositioning the bed is made by the operator (step S106), it is shifted to processing at step S107. Note that the above message is only one example, and the content of the message can be arbitrarily changed. Moreover, repositioning of the bed is not necessarily required to be performed. For example, the operator may perform the following processing, allowing that the distance between the center of slice and the center of magnetic field is far.

On the other hand, when the distance between the center of slice and the center of magnetic field is smaller than the threshold (step S104: YES), the sequence control unit 120 performs shimming (step S107). This shimming is, for example, active shimming to correct a static magnetic field that has been disturbed by insert of a subject into a bore. For example, the sequence control unit 120 generates a correction magnetic field to cancel non-uniformity in the static magnetic field by controlling an electric current to be supplied to each shim coil.

Subsequently, the sequence control unit 120 performs the test scan according to the protocol for the test scan (step S108). The sequence control unit 120 collects MR data, and then k-space data is stored in the storage unit 132. In other words, the sequence control unit 120 as the registering unit incorporates the check protocol in the protocol set to be executed when the instruction is accepted.

Subsequently, the image generating unit 136 reconstructs an image using the k-space data that is collected at step S108, to display on the display unit 135 (step S109). For example, the image generating unit 136 causes the display unit 135 to display the generated image at the forefront, to let the operator view the image. At this time, the image generating unit 136 displays, for example, a GUI enabling to input whether the result of the test scan is successful together with the image of the test scan.

When an input indicating that the result of the test scan is not successful is made by the operator (step S110: NO), the improvement-processing performing unit 133d performs improvement processing (step S111). For example, the improvement-processing performing unit 133d performs at least one of shimming, change of a shimming protocol, and resetting of the center frequency as the improvement processing. As one example, the improvement-processing performing unit 133d displays a GUI to specify at least one of shimming, change of a shimming protocol, and resetting of the center frequency on the display unit 135. The improvement-processing performing unit 133d then performs improvement processing specified by the operator. In other words, the improvement-processing performing unit 133d performs the improvement processing to improve the imaging condition of the protocol with fat suppression before the protocol with fat suppression is executed, based on a result of execution of the check protocol.

For example, when shimming is specified by the operator, the improvement-processing performing unit 133d performs shimming at step S107 again. Furthermore, when change of a shimming protocol is specified, the improvement-processing performing unit 133d accepts a change to the shimming protocol. When the accepted change is confirmed, the improvement-processing performing unit 133d causes the sequence control unit 120 to perform shimming again. Moreover, when resetting of the center frequency is specified, the improvement-processing performing unit 133d causes the sequence control unit 120 to perform imaging to collect spectrum data to acquire a center frequency, and resets the center frequency based on the result. Thus, a minute deviation in a resonance frequency of a water component that is set as the center frequency is adjusted. Resetting of the center frequency may be performed after shimming at step S107. As described, the improvement-processing performing unit 133d performs the improvement processing, and then, it is shifted to processing at step S108 to perform the test scan again. When more than one improvement processing is specified, the improvement-processing performing unit 133d may perform the specified more than one improvement processing sequentially.

On the other hand, when an input indicating that the result of the test scan is successful is made by the operator (step S110: YES), the sequence control unit 120 performs imaging scan (step S112). Thereafter, the image generating unit 136 generates a desired image from the MR data that is collected by the sequence control unit 120, and displays the generated image on the display unit 135 (step S113).

Thereafter, the registration control unit 133e registers images that are acquired by a series of the protocol set of this examination excluding images acquired by the test scan (step S114). Generally, when an examination is finished, image data of images that are acquired by a series of a protocol set included in an imaging plan are registered in the storage unit 132 in association with an examination identification (ID) of the examination. However, the registration control unit 133e does not register images of image data that are acquired by the test scan in the storage unit 132.

Although a case in which a protocol of a test scan is generated after the fact has been explained in the above explanation, it is not limited thereto. For example, a protocol of a test scan may be stored in the storage unit 132 in advance. When accepting an instruction to include a test scan in a protocol from an operator, the imaging-condition setting unit 133a can read a protocol of the test scan stored in the storage unit 132, and insert the read protocol in the protocol set. Furthermore, in this case, protocols stored in the storage unit 132 may be defined, for example, per body part, or may be defined as a common protocol in various kinds of fat suppression.

Furthermore, for example, the improvement-processing performing unit 133d is not required to display a GUI to specify improvement processing. For example, when an input indicating that the result of a test scan is not successful is made by an operator, the improvement-processing performing unit 133d may perform predetermined improvement processing. Specifically, when shimming is set as improvement processing in advance, the improvement-processing performing unit 133d can perform shimming automatically when an input indicating that a result of a test scan is not successful is made by an operator. Moreover, for example, the improvement-processing performing unit 133d may only display a message to propose information about improvement processing without performing the improvement processing itself.

Furthermore, as for the processing procedure described above, not all of the processing procedure is not necessarily required to be performed. For example, the processing of accepting whether a test scan is required at step S101, the processing performed by the generating unit 133b at step S103, the processing performed by the determining unit 133c at steps S104 to S106, the processing performed by the improvement-processing performing unit 133d at step S111, and the processing performed by the registration control unit 133e at step S114 are not necessarily required to be performed, and may be performed in appropriate combination as necessary.

As described above, in the MRI apparatus 100 according to the first embodiment, when imaging scan to collect image data of an output image with fat suppression, the imaging-condition setting unit 133a accepts an instruction whether to include a test scan to check the influence of the fat suppression in a protocol set that is included in an examination. When the instruction is accepted, the sequence control unit 120 performs the test scan before performing the imaging scan. Therefore, the MRI apparatus 100 can perform imaging with fat suppression appropriately.

For example, when imaging scan with fat suppression is performed, the MRI apparatus 100 performs a simple test scan to check the influence of the fat suppression according to a request of an operator. Therefore, the operator can determine whether a sufficient fat suppression effect can be expected by checking an image that is acquired by this test scan. If a sufficient fat suppression effect is not expected, the operator can try an improvement means to acquire a sufficient fat suppression effect, or can perform a test scan again until it is determined that a sufficient fat suppression effect can be expected without performing an imaging scan. As a result, the MRI apparatus 100 can perform imaging with fat suppression appropriately.

Furthermore, in the MRI apparatus 100, for example, when an instruction to include a test scan in a protocol set is accepted, the generating unit 133b generates a protocol of a test scan based on a protocol of an imaging scan. Therefore, the MRI apparatus 100 can perform a test scan under a condition close to an imaging condition of the imaging scan, and therefore, can improve the accuracy of the test scan.

Moreover, for example, in the MRI apparatus 100, the determining unit 133c determines whether a protocol of a test scan satisfies a predetermined condition, and outputs a result of determination, before the test scan is performed. For example, the determining unit 133c determines whether a distance between the center of slice and the center of magnetic field is smaller than a threshold, and displays a result of determination on the display unit 135. Therefore, an operator can determine whether a sufficient fat suppression effect can be expected before the test scan is performed, by referring to the result of determination.

Furthermore, in the MRI apparatus 100, the improvement-processing performing unit 133d performs improvement processing to improve a protocol of an imaging scan during a period from a test scan to an imaging scan. Therefore, an operator can perform imaging with fat suppression appropriately, without searching for an improvement means by himself/herself. For example, by performing resetting of the center frequency as improvement processing, a resonance frequency of a fat component that is set based on the center frequency is appropriately adjusted, and therefore, imaging with fat suppression can be appropriately performed.

Moreover, for example, in the MRI apparatus 100, the registration control unit 133e registers image data that is acquired according to a protocol included in a protocol set of one examination in the storage unit 132 excluding image data that is acquired by a test scan. As described, the MRI apparatus 100 does not register image data from a test scan even if a test scan for fat suppression is performed, and therefore, increase of an amount of data registered for the examination can be suppressed.

Other Embodiments

The first embodiment has been explained, but various different embodiments may be performed in addition to this.

Test Scan Provided as Preset Data

For example, although a case in which an operator instructs whether to include a test scan in a protocol set has been explained in the above embodiment, embodiments are not limited thereto. For example, a protocol of a test scan may be incorporated in a protocol set as preset data in advance.

Figure 6:
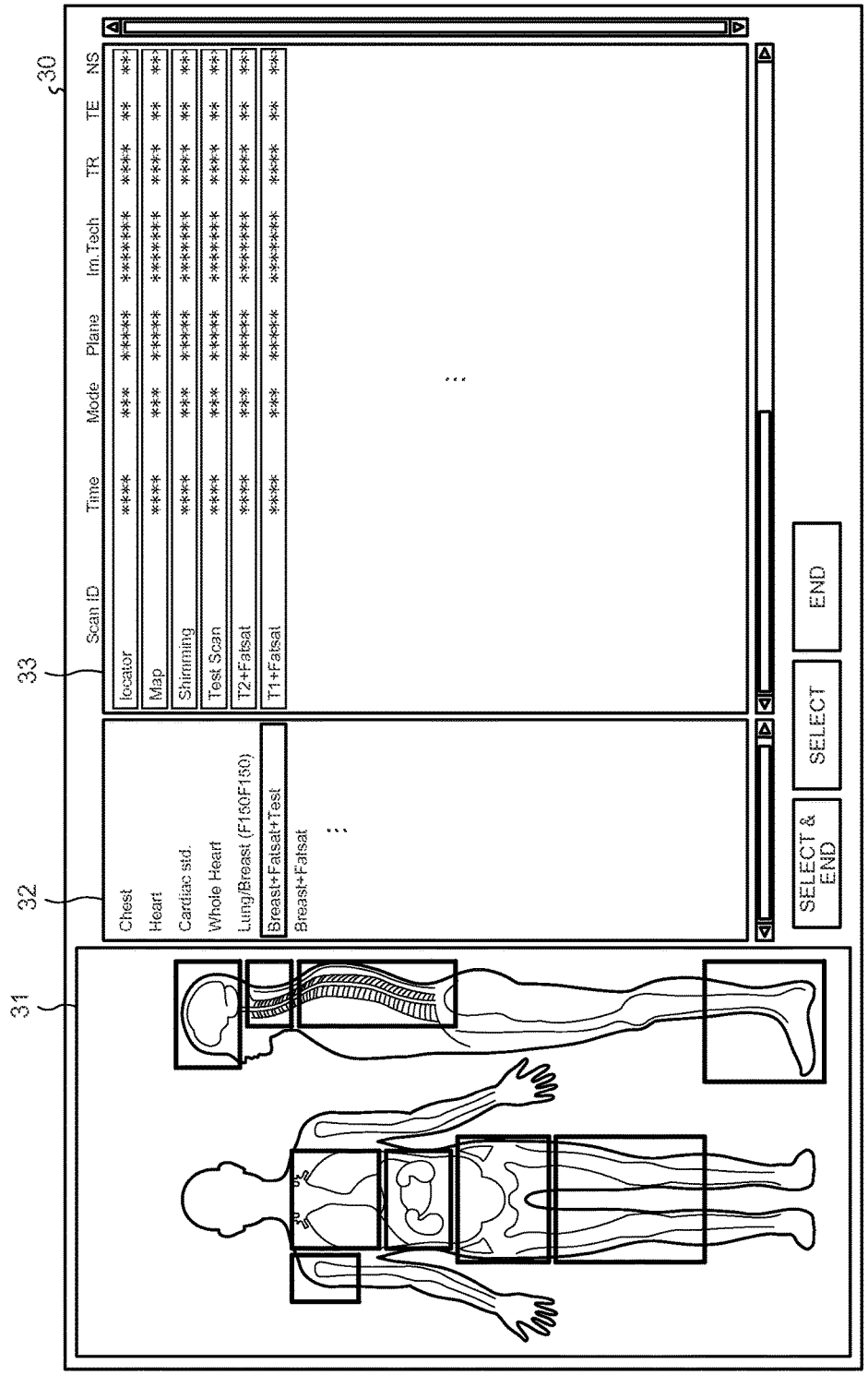
FIG. 6 is a diagram showing one example of a display screen for imaging condition input in another embodiment.

FIG. 6 is a diagram showing one example of the display screen 30 for imaging planning in another embodiment. In FIG. 6, "Breast+Fatsat+Test" in the region 32 is a protocol set in which a test scan to check the influence of fat suppression is incorporated in "Breast+Fatsat" that is a protocol set to image a breast part with fat suppression. When an operator selects "Breast+Fatsat+Test" on this region 32, a list of protocols in which a protocol of "Test Scan" has been inserted is displayed in the region 33.

That is, the imaging-condition setting unit 133a accepts an instruction to select either one of the protocol sets from among protocol sets including an imaging scan with fat suppression, and protocol sets further including a test scan for fat suppression in addition to these protocol sets. Subsequently, the sequence control unit 120 performs a test scan before performing an imaging scan when an instruction to select a protocol set including a test scan is accepted. This enables to perform a test scan without making an instruction whether to include a test scan in a protocol set by an operator. When a test scan is not wished to be performed, an operator can specify a protocol set in which a protocol of a test scan is not inserted, by selecting "Breast+Fatsat" in the region 32.

Other Configuration

The respective components in the respective apparatuses shown in the explanation of the first to the second embodiments are of functional concept, and it is not necessarily required to be physically configured as shown in the drawings. Specifically, a specific form of distribution and integration of the respective devices are not limited to the ones shown in the drawings, and it can be configured such that all or a part thereof is functionally or physically distributed or integrated in arbitrary units according to various kinds of load and usage condition and the like. Furthermore, as for the respective processing functions of the respective devices, all or an arbitrary part thereof can be implemented by a central processing unit (CPU) and a computer program that is analyzed and executed by the CPU, or can be implemented as hardware by wired logic.

Figure 7:
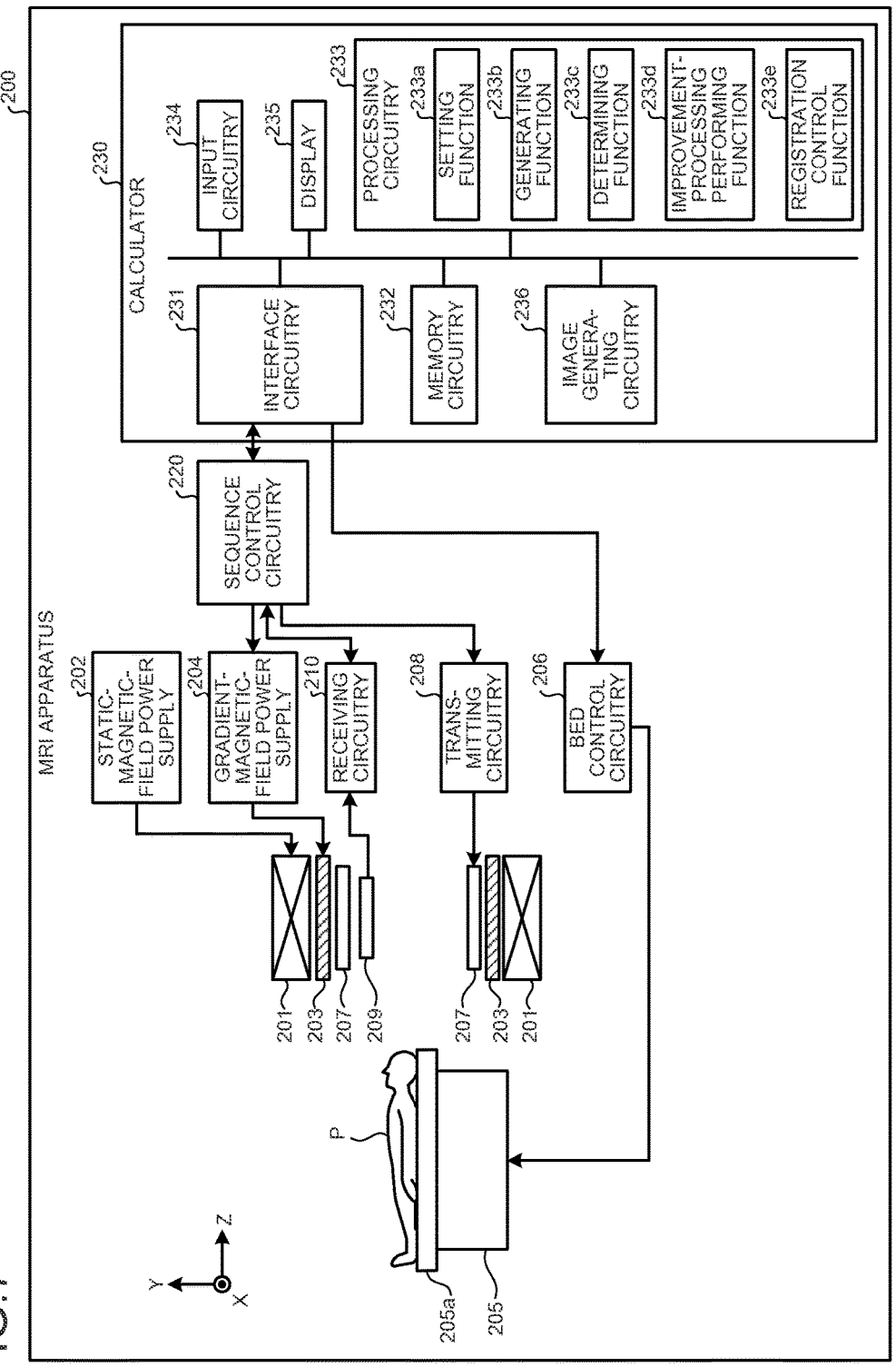
FIG. 7 is a functional block diagram showing a configuration of an MRI apparatus according to other embodiments.

For example, the MRI apparatus 100 shown in FIG. 1 may be configured as shown in FIG. 7. FIG. 7 is a functional block diagram showing a configuration of an MRI apparatus according to other embodiments.

As shown in FIG. 7, an MRI apparatus 200 includes a static field magnet 201, a static-magnetic-field power supply 202, a gradient magnetic-field coil 203, a gradient-magnetic-field power supply 204, a bed 205, bed control circuitry 206, a transmission coil 207, transmitting circuitry 208, a reception coil 209, receiving circuitry 210, sequence control circuitry 220, and a calculator 230. The static field magnet 201, the static-magnetic-field power supply 202, the gradient magnetic-field coil 203, the gradient-magnetic-field power supply 204, the bed 205, the bed control circuitry 206, the transmission coil 207, the transmitting circuitry 208, the reception coil 209, the receiving circuitry 210, the sequence control circuitry 220, and the calculator 230 correspond to the static field magnet 101, the static-magnetic-field power supply 102, the gradient magnetic-field coil 103, the gradient-magnetic-field power supply 104, the bed 105, the bed controller 106, the transmission coil 107, the transmitting unit 108, the reception coil 109, the receiving unit 110, the sequence control unit 120, and the calculator 130 shown in FIG. 1, respectively.

The calculator 230 includes interface circuitry 231, memory circuitry 232, processing circuitry 233, input circuitry 234, a display 235, and image generating circuitry 236. The interface circuitry 231, the memory circuitry 232, the processing circuitry 233, the input circuitry 234, the display 235, and the image generating circuitry 236 correspond to the interface unit 131, the storage unit 132, the control unit 133, the input unit 134, the display unit 135, and the image generating unit 136 shown in FIG. 1, respectively. The processing circuitry 233 is an example of processing circuitry in the accompanying claims.

The processing circuitry 233 performs a setting function 233a, a generating function 233b, a determining function 233c, an improvement-processing performing function 233d, and a registration control function 233e. The setting function 233a is a function implemented by the imaging-condition setting unit 133a illustrated in FIG. 1. The generating function 233b is a function implemented by the generating unit 133b illustrated in FIG. 1. The determining function 233c is a function implemented by the determining unit 133c illustrated in FIG. 1. The improvement-processing performing function 233d is a function implemented by the improvement-processing performing unit 133d illustrated in FIG. 1. The registration control function 233e is a function implemented by the registration control unit 133e illustrated in FIG. 1.

For example, each of the respective processing functions performed by the setting function 233a, the generating function 233b, the determining function 233c, the improvement-processing performing function 233d, and the registration control function 233e, which are components of the processing circuitry 233 illustrated in FIG. 7, is stored in the memory circuitry 232 in a form of a computer-executable program. The processing circuitry 233 is a processor that loads programs from the memory circuitry 232 and executes the programs so as to implement the respective functions corresponding to the programs. In other words, the processing circuitry 233 that has loaded the programs has the functions illustrated in the processing circuitry 233 in FIG. 7. That is, the processing circuitry 233 loads a program corresponding to the setting function 233a from the memory circuitry 232 and executes the program so as to perform the same processing as that of the imaging-condition setting unit 133a. The processing circuitry 233 loads a program corresponding to the generating function 233b from the memory circuitry 232 and executes the program so as to perform the same processing as that of the generating unit 133b. The processing circuitry 233 loads a program corresponding to the determining function 233c from the memory circuitry 232 and executes the program so as to perform the same processing as that of the determining unit 133c. The processing circuitry 233 loads a program corresponding to the improvement-processing performing function 233d from the memory circuitry 232 and executes the program so as to perform the same processing as that of the improvement-processing performing unit 133d. The processing circuitry 233 loads a program corresponding to the registration control function 233e from the memory circuitry 232 and executes the program so as to perform the same processing as that of the registration control unit 133e.

For example, Steps S101 illustrated in FIG. 2 is a step that is implemented by the processing circuitry 233 loading the program corresponding to the setting function 233a from the memory circuitry 232 and executing the program. Step S103 illustrated in FIG. 2 is a step that is implemented by the processing circuitry 233 loading the program corresponding to the generating function 233b from the memory circuitry 232 and executing the program. Step S104 illustrated in FIG. 2 is a step that is implemented by the processing circuitry 233 loading the program corresponding to the determining function 233c from the memory circuitry 232 and executing the program. Step S111 illustrated in FIG. 2 is a step that is implemented by the processing circuitry 233 loading the program corresponding to the improvement-processing performing function 233d from the memory circuitry 232 and executing the program. Step S114 illustrated in FIG. 2 is a step that is implemented by the processing circuitry 233 loading the program corresponding to the registration control function 233e from the memory circuitry 232 and executing the program.

In FIG. 7, the processing functions performed by the setting function 233a, the generating function 233b, the determining function 233c, the improvement-processing performing function 233d, and the registration control function 233e are described as being implemented in the single processing circuit. The functions, however, may be implemented by configuring a processing circuit by combining a plurality of separate processors and causing each of the processors to execute a program.

The term "processor" used in the above description means, for example, a central preprocess unit (CPU) and a graphics processing unit (GPU), or a circuit such as an application specific integrated circuit (ASIC), a programmable logic device (for example, a simple programmable logic device (SPLD)), a complex programmable logic device (CPLD), and a field programmable gate array (FPGA). The processor implements a function by loading and executing a program stored in a storage circuit. Instead of being stored in a storage circuit, the program may be built directly in a circuit of the processor. In this case, the processor implements a function by loading and executing the program built in the circuit. The processors in the present embodiment are not limited to a case in which each of the processors is configured as a single circuit. A plurality of separate circuits may be combined as one processor that implements the respective functions. Furthermore, the components illustrated in FIG. 7 may be integrated into one processor that implements the respective functions.

The respective circuitry exemplified in FIG. 7 may be distributed or integrated as appropriate. For example, the processing circuitry 233 and the image generating circuitry 236 may be integrated.

According to a magnetic-resonance imaging apparatus of at least one of the embodiments described above, setting of various regions can be facilitated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic-resonance imaging apparatus comprising:
processing circuitry configured to
register a predetermined protocol set that is selected from among a plurality of protocol sets preset in memory circuitry, as a protocol set to be executed in an examination of a subject, accept an instruction whether to include a check protocol to check an influence of fat suppression in the examination, and incorporate the check protocol in the protocol to be executed when the instruction is accepted, wherein the processing circuitry is further configured to determine, when the check protocol is incorporated in the protocol set to be executed, whether a distance between an imaging region of the check protocol and a center of magnetic field satisfies a predetermined condition before the check protocol is executed.

2. The magnetic-resonance imaging apparatus according to claim 1, wherein the processing circuitry is configured to derive a parameter of the check protocol based on a parameter of a protocol with fat suppression in the protocol set to be executed when the instruction is accepted.

3. The magnetic-resonance imaging apparatus according to claim 2, wherein the processing circuitry is configured to derive a parameter of the check protocol by changing a value of at least one of number of phase encoding, number of slices, a speed rate in parallel imaging, and a repetition time, among parameters of the protocol with fat suppression.

4. The magnetic-resonance imaging apparatus according to claim 1, wherein the processing circuitry is configured to determine whether the distance is equal to or larger than a threshold, and displays a result of determination on a display unit when the distance is equal to or larger than the threshold.

5. The magnetic-resonance imaging apparatus according to claim 1, wherein the processing circuitry is further configured to perform improvement processing to improve an imaging condition of the protocol with fat suppression based on a result of execution of the check protocol, before the protocol with fat suppression is executed.

6. The magnetic-resonance imaging apparatus according to claim 5, wherein the improvement processing is at least one of shimming, changing a protocol used in shimming, and resetting a center frequency.

7. The magnetic-resonance imaging apparatus according to claim 1, wherein the processing circuitry is further configured to store image data that is acquired by imaging according to the protocol set to be executed in memory circuitry, excluding image data acquired by the check protocol.

8. A magnetic-resonance imaging apparatus comprising processing circuitry configured to derive, based on a parameter of a protocol with fat suppression in a protocol set to be executed, a parameter of a check protocol to check an influence of the fat suppression, and that registers the check protocol in the protocol set to be executed, wherein the processing circuitry is further configured to determine, when the check protocol is incorporated in the protocol set to be executed, whether a distance between an imaging region of the check protocol and a center of magnetic field satisfies a predetermined condition before the check protocol is executed.

9. The magnetic-resonance imaging apparatus according to claim 8, wherein the processing circuitry is configured to derive a parameter of the check protocol by changing a value of at least one of number of phase encoding, number of slices, a speed rate in parallel imaging, and a repetition time, among parameters of the protocol with fat suppression.

10. The magnetic-resonance imaging apparatus according to claim 8, wherein the processing circuitry is configured to determine whether the distance is equal to or larger than a threshold, and displays a result of determination on a display unit when the distance is equal to or larger than the threshold.

11. The magnetic-resonance imaging apparatus according to claim 8, wherein the processing circuitry is further configured to perform improvement processing to improve an imaging condition of the protocol with fat suppression based on a result of execution of the check protocol, before the protocol with fat suppression is executed.

12. The magnetic-resonance imaging apparatus according to claim 11, wherein the improvement processing is at least one of shimming, changing a protocol used in shimming, and resetting a center frequency.

13. The magnetic-resonance imaging apparatus according to claim 8, wherein the processing circuitry is further configured to store image data that is acquired by imaging according to the protocol set to be executed in memory circuitry, excluding image data acquired by the check protocol.

14. A magnetic-resonance imaging apparatus comprising processing circuitry configured to perform, before a protocol with fat suppression is executed, improvement processing to improve an imaging condition of the protocol with fat suppression based on a result of execution of a check protocol to check an influence of fat suppression, wherein the processing circuitry is further configured to determine, when the check protocol is incorporated in the protocol set to be executed, whether a distance between an imaging region of the check protocol and a center of magnetic field satisfies a predetermined condition before the check protocol is executed.

15. The magnetic-resonance imaging apparatus according to claim 14, wherein the improvement processing is at least one of shimming, changing a protocol used in shimming, and resetting a center frequency.

16. The magnetic-resonance imaging apparatus according to claim 14, wherein the processing circuitry is configured to determine whether the distance is equal to or larger than a threshold, and displays a result of determination on a display unit when the distance is equal to or larger than the threshold.

17. The magnetic-resonance imaging apparatus according to claim 14, wherein the processing circuitry is further configured to store image data that is acquired by imaging according to a protocol set to be executed in memory circuitry, excluding image data acquired by the check protocol.

* * * * *